(12) United States Patent
Hashimoto

(10) Patent No.: US 7,952,361 B2
(45) Date of Patent: May 31, 2011

(54) TEST APPARATUS

(75) Inventor: Yoshihiro Hashimoto, Saitama (JP)

(73) Assignee: Advantest Corporation, Tokyo (JP)

( * ) Notice: Subject to any disclaimer, the term of this patent is extended or adjusted under 35 U.S.C. 154(b) by 164 days.

(21) Appl. No.: 12/502,946

(22) Filed: Jul. 14, 2009

(65) Prior Publication Data

US 2011/0012622 A1    Jan. 20, 2011

(51) Int. Cl.
G01R 31/02 (2006.01)
G01R 27/08 (2006.01)
G01R 31/00 (2006.01)

(52) U.S. Cl. .................. 324/537; 324/713; 324/756.01

(58) Field of Classification Search .............. 324/537, 324/678, 713, 756.01, 762.01
See application file for complete search history.

(56) References Cited

U.S. PATENT DOCUMENTS

| | | | |
|---|---|---|---|
| 5,789,934 A | 8/1998 | Kolkowski et al. | |
| 6,087,843 A | 7/2000 | Pun et al. | |
| 6,323,668 B1 | 11/2001 | Hashimoto | |
| 6,433,527 B1 * | 8/2002 | Izadinia et al. ............ | 323/300 |
| 6,556,034 B1 | 4/2003 | Johnson et al. | |
| 7,005,867 B2 | 2/2006 | Hashimoto | |
| 7,132,844 B2 | 11/2006 | Hashimoto | |
| 7,576,555 B2 * | 8/2009 | Hashimoto .............. | 324/126 |
| 7,825,666 B2 * | 11/2010 | Hashimoto .............. | 324/522 |
| 2001/0017769 A1 | 8/2001 | Ito | |
| 2002/0135340 A1 | 9/2002 | Hashimoto | |
| 2008/0174318 A1 | 7/2008 | Seki | |
| 2009/0121725 A1 | 5/2009 | Hashimoto | |

FOREIGN PATENT DOCUMENTS

| | | |
|---|---|---|
| JP | 7-209372 A | 8/1995 |
| JP | 7-248353 A1 | 9/1995 |
| JP | 11-23655 A | 1/1999 |
| JP | 2001-195139 A | 7/2001 |
| JP | 2001-251034 A | 9/2001 |
| JP | 2006-344740 A | 12/2006 |
| JP | 2009-74900 A | 4/2009 |
| JP | 2009-115794 A | 5/2009 |
| WO | 2006/054435 A1 | 5/2006 |

OTHER PUBLICATIONS

International Search Report (ISR) for PCT/JP2009/003482 (related PCT application).
Applicant bring the attention of the Examiner to the following pending U.S. Appl. No. 12/603,350, filed Oct. 21, 2009, U.S. Appl. No. 12/876,052, filed Sep. 3, 2010, U.S. Appl. No. 12/876,057, filed Sep. 3, 2010, U.S. Appl. No. 12/877,097, filed Sep. 7, 2010.

* cited by examiner

*Primary Examiner* — Timothy J Dole
(74) *Attorney, Agent, or Firm* — Chen Yoshimura LLP

(57) ABSTRACT

Provided is a test apparatus that tests a device under test, including a power supply that generates supply power supplied to the device under test; a transmission path that transmits the supply power generated by the power supply to the device under test; a high-capacitance capacitor that is provided between the transmission path and a ground potential; a low-capacitance capacitor that has a lower capacitance than the high-capacitance capacitor and that is provided between the transmission path and the ground potential at a position closer to the device under test than the high-capacitance capacitor is to the device under test; an intermediate capacitor that is provided between the transmission path and the ground potential at a position between the high-capacitance capacitor and the low-capacitance capacitor; and a current measuring section that measures current flowing through the transmission path between the intermediate capacitor and the low-capacitance capacitor.

8 Claims, 5 Drawing Sheets

TEST APPARATUS

BACKGROUND

1. Technical Field

The present invention relates to a test apparatus.

2. Related Art

When testing a device under test such as a semiconductor circuit, a power supply apparatus that supplies current to the device under test is unable to quickly track fluctuation in the current consumed by the device under test. Japanese Patent Application Publication No. 2001-195139 discloses providing a bypass capacitor to the power supply line near the device under test to solve this problem.

When there is great fluctuation in the power supply current, a bypass capacitor conductor with a high capacitance, e.g. tens of $\mu F$, is provided to track this fluctuation. A small output current of the power supply apparatus is measured to measure a small current such as the standby current. In this case, the load capacitance connected to the power supply apparatus is limited, and so a reed relay is provided to separate the high-capacitance capacitor from the power supply line.

However, there is a limited space near the device under test, and so the reed relay cannot be provided. Therefore, the high-capacitance bypass capacitor is provided at a position that is not near the device under test.

As a result, the power supply line is lengthened from the bypass capacitor to the device under test, which increases the inductance component between the bypass capacitor and the device under test. Therefore, it is difficult to supply a high-frequency current from the bypass capacitor to the device under test.

One test that can be performed on the device under test is a test for measuring the current consumed when the device under test is operating. In this test, the current consumed by the device under test is measured by measuring the current flowing through the power supply line. More specifically, the current consumed by the device under test is measured by measuring the current flowing through the power supply line at a position closer to the device under test than to the bypass capacitor.

However, as explained above, it is difficult to supply a high-frequency signal from the high-capacitance bypass capacitor to the device under test. Therefore, even if the current flowing thought the power supply line is measured between the high-capacitance bypass capacitor and the device under test, it is difficult to accurately measure a current consumed by the device under test that fluctuates at a high frequency.

SUMMARY

Therefore, it is an object of an aspect of the innovations herein to provide a test apparatus, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a power supply that generates supply power supplied to the device under test; a transmission path that transmits the supply power generated by the power supply to the device under test; a high-capacitance capacitor that is provided between the transmission path and a ground potential; a low-capacitance capacitor that has a lower capacitance than the high-capacitance capacitor and that is provided between the transmission path and the ground potential at a position closer to the device under test than the high-capacitance capacitor is to the device under test; an intermediate capacitor that is provided between the transmission path and the ground potential at a position between the high-capacitance capacitor and the low-capacitance capacitor; and a current measuring section that measures current flowing through the transmission path between the intermediate capacitor and the low-capacitance capacitor.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
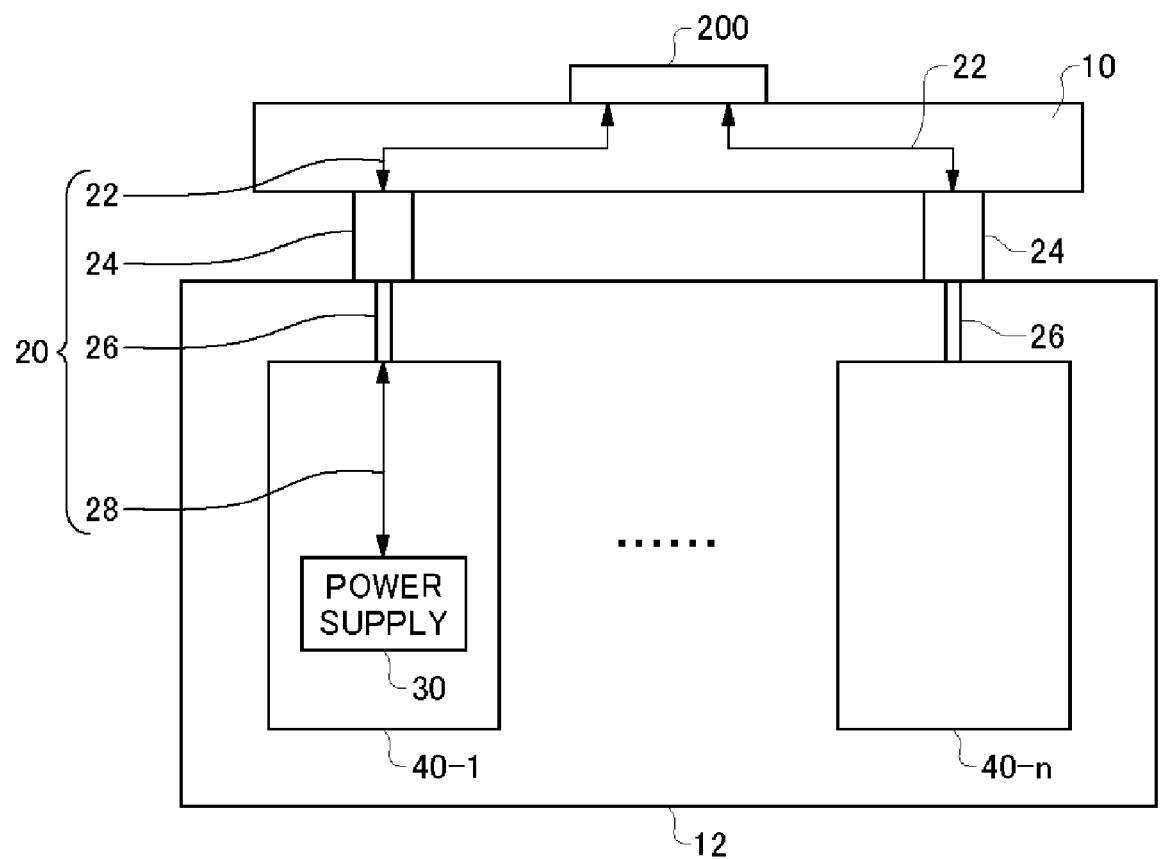
FIG. 1 shows an exemplary configuration of a test apparatus 100 according to an embodiment of the present invention, along with a device under test 200.

FIG. 1 shows an exemplary configuration of a test apparatus 100 according to an embodiment of the present invention, along with a device under test 200. The test apparatus 100 tests the device under test 200, which is a semiconductor circuit or the like, and is provided with a test board 10 and a test head 12.

The test board 10 electrically connects the device under test 200 to the test head 12. For example, the test board 10 may be loaded on the device under test 200 and include a socket electrically connected to the device under test 200 and wiring electrically connecting the socket to the test head 12. The test board 10 may instead include a probe pin that contacts a terminal of the device under test 200 and wiring that electrically connects the probe pin to the test head 12.

The test head 12 generates a test signal, supply power, and the like, and supplies them to the device under test 200 via the test board 10. The test head 12 measures a prescribed characteristic of the device under test 200 when the test signal or the like is supplied to the device under test 200, and judges the acceptability of the device under test 200 based on the measurement result. For example, the test head 12 may measure a data pattern of a signal output by the device under test 200, power consumed by the device under test 200, or the like.

The test head 12 of the present embodiment includes a plurality of test modules 40. Each test module 40 is electrically connected to the test board 10 via a connector 24. Each test module 40 may have a different function. For example, the test head 12 may include a test module 40 for the power supply, a test module 40 for an analog signal, a test module 40 for a digital signal, and the like.

The test module 40-1 of the present embodiment includes a power supply 30 for supplying the device under test 200 with supply power. The power supply 30 is electrically connected to the device under test 200 via the transmission path 20.

The transmission path 20 transmits the supply power generated by the power supply 30 to the device under test 200. The transmission path 20 may include a module wire 28, a cable 26, a connector 24, and a board wire 22. The module wire 28 is formed within the test module 40. The cable 26 connects the test module 40 to the connector 24. The board wire 22 is formed on the test board 10.

The test apparatus 100 of the present embodiment measures the current consumed by the device under test 200 by measuring the current flowing through the transmission path 20. The test module 40-1 judges the acceptability of the device under test 200 based on the measurement result of the current flowing through the transmission path 20.

Figure 2:
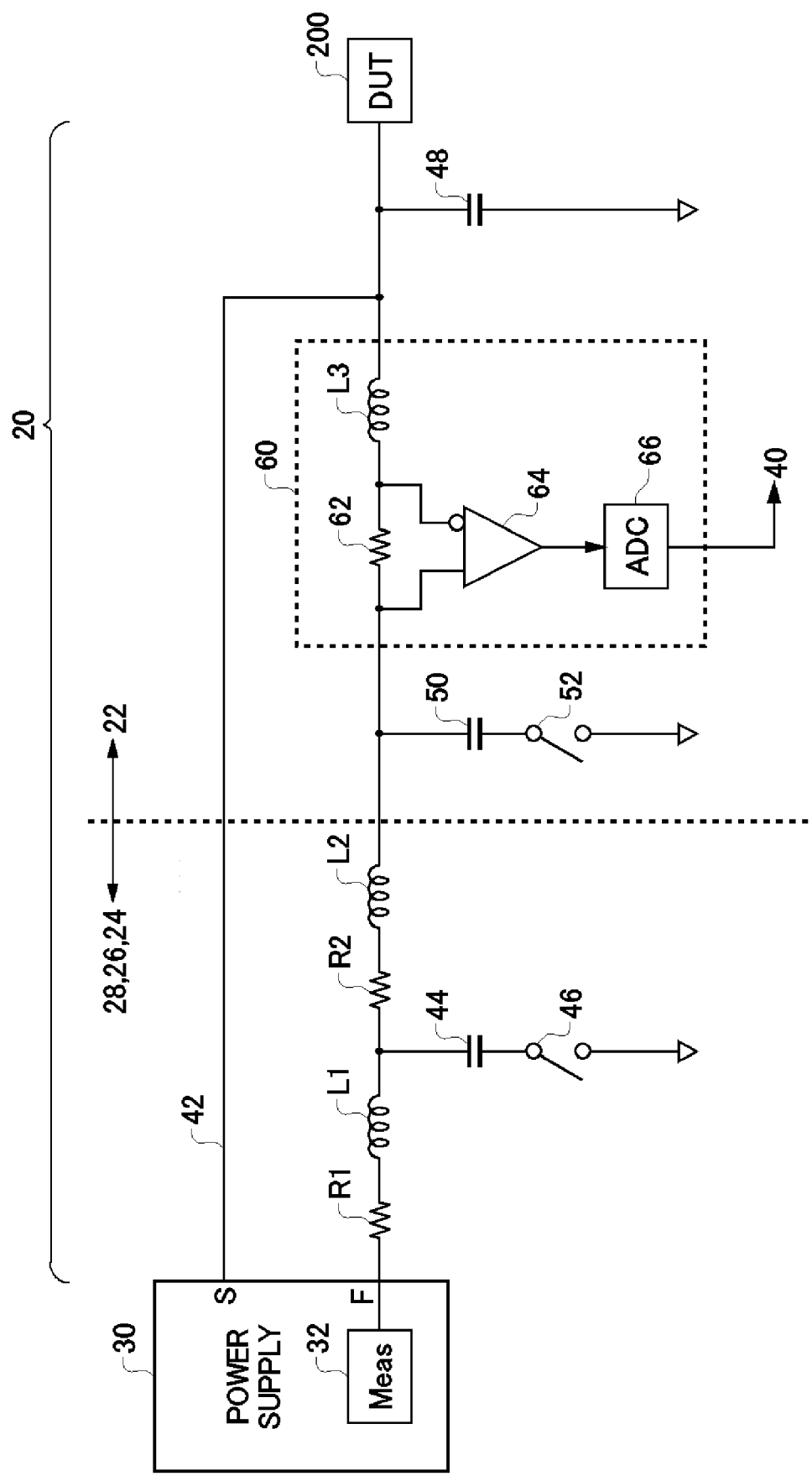
FIG. 2 shows an exemplary configuration of a circuit for measuring the current flowing through the transmission path 20.

FIG. 2 shows an exemplary configuration of a circuit for measuring the current flowing through the transmission path 20. As described above, the power supply 30 is connected to the device under test 200 via the transmission path 20. The power supply 30 may include a small current measuring section 32 that measures a small current, such as a standby current, of the device under test 200. The small current measuring section 32 may measure the current output by the power supply 30.

The test apparatus 100 is provided with a high-capacitance capacitor 44, a switch 46, an intermediate capacitor 50, a switch 52, a low-capacitance capacitor 48, and a current measuring section 60. In FIG. 2, R1, R2, L1, L2, and L3 represent resistance components and inductance components of the transmission path 20 between the power supply 30 and each capacitor.

The high-capacitance capacitor 44 is provided between the transmission path 20 and a ground potential. The high-capacitance capacitor 44 of the present embodiment is provided between a ground potential and a position on the transmission path 20 in the connector 24 on the power supply 30 side, e.g. the module wire 28. The capacitance of the high-capacitance capacitor 44 may be greater than the maximum load capacitance allowed for the small current measuring section 32. This maximum load capacitance may be a value according to specifications of the small current measuring section 32.

The switch 46 switches whether the high-capacitance capacitor 44 is connected between the module wire 28 and the ground potential. The switch 46 may be a reed relay, for example.

The low-capacitance capacitor 48 is provided between the transmission path 20 and the ground potential at a position closer to the device under test 200 than the high-capacitance capacitor 44 is to the device under test 200. The low-capacitance capacitor 48 of the present embodiment is provided between the board wire 22 and the ground potential. The capacitance of the low-capacitance capacitor 48 may be less than the capacitance of the high-capacitance capacitor 44. The capacitance of the low-capacitance capacitor 48 may be less than the maximum load capacitance allowed for the small current measuring section 32.

The intermediate capacitor 50 is provided between the transmission path 20 and the ground potential at a position between the high-capacitance capacitor 44 and the low-capacitance capacitor 48. The intermediate capacitor 50 is desirably connected to the transmission path 20 at a position that is closer to the low-capacitance capacitor 48 than to the high-capacitance capacitor 44.

More specifically, the intermediate capacitor 50 is desirably positioned such that (i) the inductance component L3 of the transmission path 20 between the intermediate capacitor 50 and the low-capacitance capacitor 48 is sufficiently less than (ii) the inductance component L2 of the transmission path 20 between the intermediate capacitor 50 and the high-capacitance capacitor 44. The intermediate capacitor 50 of the present embodiment is connected to the board wire 22 between the low-capacitance capacitor 48 and the connector 24. By providing the intermediate capacitor 50 closer to the device under test 200 than to the cable 26 and the connector 24, the inductance component L3 can be made sufficiently less than the inductance component L2.

The capacitance of the intermediate capacitor 50 may be greater than the capacitance of the low-capacitance capacitor 48 and less than the capacitance of the high-capacitance capacitor 44. For example, the capacitance of the low-capacitance capacitor 48 may be approximately 1 μF and the capacitance of the intermediate capacitor 50 may be approximately 10 μF. The capacitance of the intermediate capacitor 50 may be greater than the maximum load capacitance allowed for the small current measuring section 32.

The switch 52 switches whether the intermediate capacitor 50 is connected between the module wire 28 and the ground potential. The switch 52 may be smaller than the switch 46. The switch 52 may be a semiconductor switch. When measuring a small current with the small current measuring section 32, the switches 46 and 52 may remove the high-capacitance capacitor 44 and the intermediate capacitor 50 from between the transmission path 20 and the ground potential.

The current measuring section 60 measures the current flowing through the transmission path 20 between the intermediate capacitor 50 and the low-capacitance capacitor 48. The current measuring section 60, the intermediate capacitor 50, the switch 52, and the low-capacitance capacitor 48 may be provided to the test board 10.

The current measuring section 60 of the present embodiment includes a detection resistor 62, a differential circuit 64, and an ADC 66. The detection resistor 62 is provided in the transmission path 20, and causes a voltage drop that corresponds to the current value flowing through the transmission path 20. The detection resistor 62 of the present embodiment is provided in the board wire 22.

The differential circuit 64 detects a potential difference between the ends of the detection resistor 62. The current flowing through the detection resistor 62 can be detected by multiplying the potential difference by the resistance value of the detection resistor 62. The detection resistor 62 and the differential circuit 64 function as a detecting section that detects the current flowing through the transmission path 20 and converts this current into a voltage.

The ADC 66 converts the voltage detected by the detecting section into a digital value. The ADC 66 may function as a voltage measuring section that measures the voltage detected by the detecting section. The ADC 66 may notify the test module 40-1 concerning the converted digital value.

The configuration of the detecting section is not limited to the example shown in FIG. 2. For example, the current measuring section 60 may include a current probe in place of the detection resistor 62 and the differential circuit 64. The current probe may measure the current flowing through the transmission path 20 by converting a magnetic field caused by the current flowing through the transmission path 20 into a voltage.

As described above, by providing the intermediate capacitor 50 near the device under test 200 and providing the current measuring section 60 between the intermediate capacitor 50 and the device under test 200, the test apparatus 100 can accurately measure the current consumed by the device under test 200 that fluctuates at a high frequency.

By forming the switch 52 as a semiconductor switch, the switch 52 can be easily provided to the test board 10, which has a structural limitation with regard to the height and such of included elements. Therefore, even when the intermediate capacitor 50 provided to the test board 10 has a relatively large capacitance, the switch 52 can be provided to control whether the intermediate capacitor 50 is separated from the transmission path 20.

The power supply 30 may detect, via the detection line 42, the load voltage applied to the device under test 200. The power supply 30 controls the output voltage such that the detected load voltage remains constant. The detection line 42 may detect the voltage of the transmission path 20 closer to the device under test 200 than the current measuring section 60.

Figure 3:
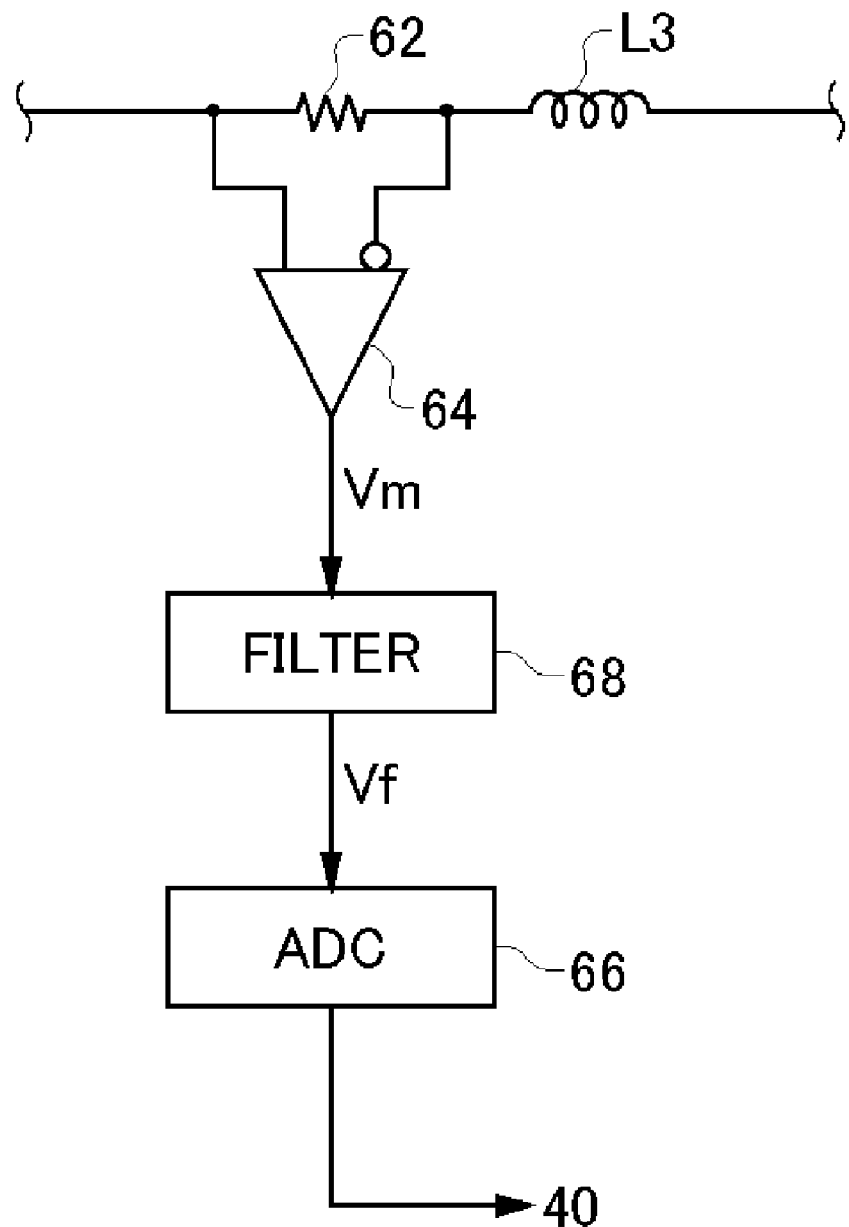
FIG. 3 shows another exemplary configuration of the current measuring section 60.

FIG. 3 shows another exemplary configuration of the current measuring section 60. The current measuring section 60 of the present embodiment includes a filter 68 in addition to the configuration of the current measuring section 60 described in relation to FIG. 2. The remaining configuration may be the same as that of the current measuring section 60 described in relation to FIG. 2.

The filter 68 eliminates a prescribed high-frequency component from the voltage output by the detecting section, i.e. the detection resistor 62 and the differential circuit 64. The filter 68 eliminates the prescribed high-frequency component from the output voltage of the detecting section such that the level of the resonance frequency of the series resonance of the output voltage caused by the detection resistor 62, the inductance component L3, and the low-capacitance capacitor 48 is less than a level corresponding to the current transmitted in the transmission path 20.

The filter 68 may be a low-pass filter having a degree greater than or equal to 2. The ADC 66 functions as a voltage measuring section that measures the voltage output by the filter 68.

Figure 4:
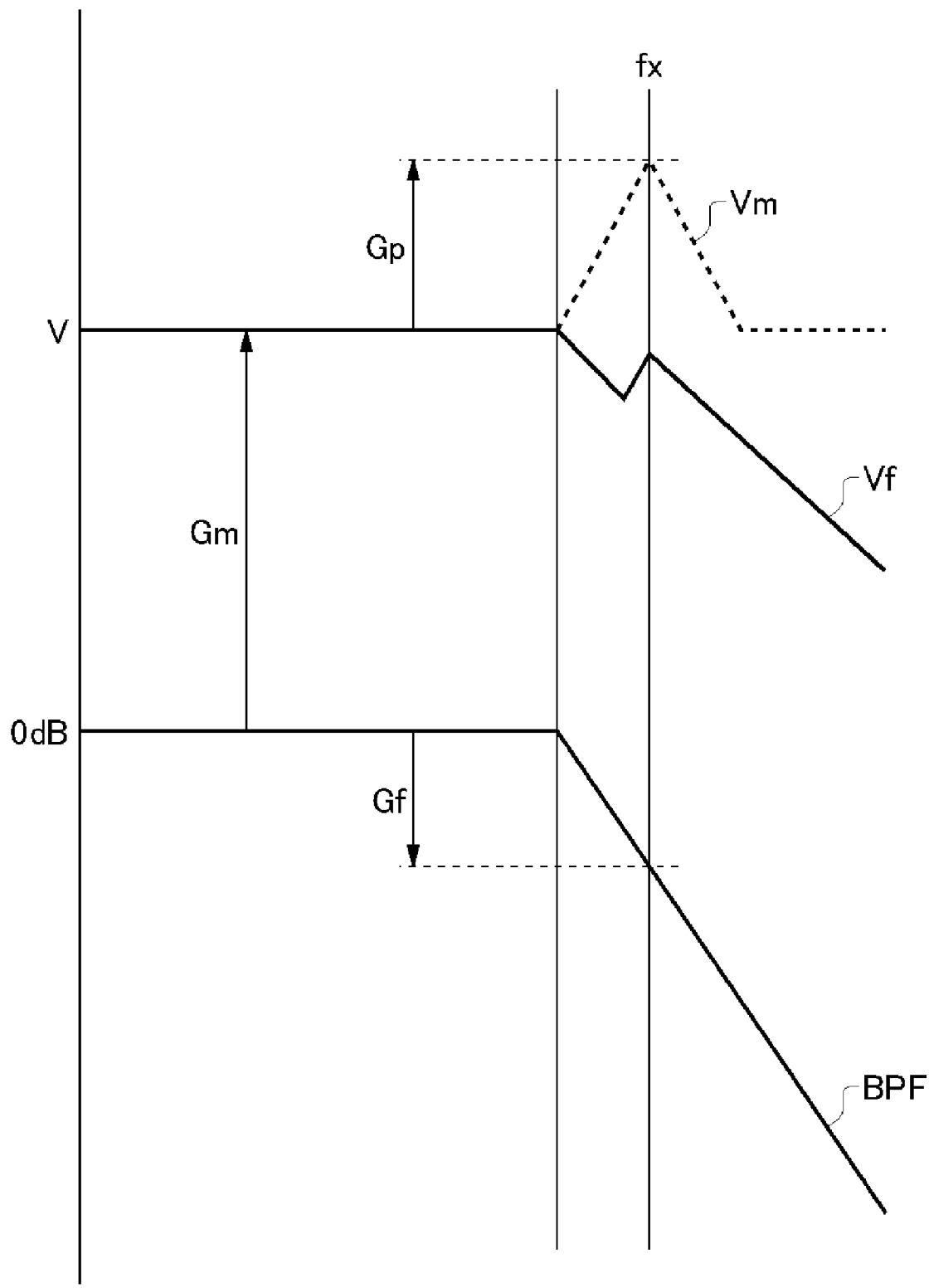
FIG. 4 shows an exemplary frequency characteristic of the filter 68.

FIG. 4 shows an exemplary frequency characteristic of the filter 68. In FIG. 4, the horizontal axis represents frequency and the vertical axis represents the gain of the filter 68 and the level of the input voltage of the filter 68. The resonance frequency of the series resonance caused by the detection resistor 62, the inductance component L3, and the low-capacitance capacitor 48 is represented by fx. The level of the input voltage of the filter 68 in a band that is not affected by the series resonance is represented by V.

The voltage Vm input to the filter 68 peaks at the resonance frequency fx due to the series resonance caused by the detection resistor 62, the inductance component L3, and the low-capacitance capacitor 48. The gain of the series resonance at the resonance frequency fx is represented as Gp. This gain Gp may be provided as a ratio of the peak at the resonance frequency fx to the voltage V.

The filter 68 has a frequency characteristic that causes the level of the output voltage to be no greater than the voltage V over the entire band. For example, the filter 68 may have a frequency characteristic that causes a cutoff frequency to be no greater than a frequency obtained by subtracting a half-value of the bandwidth of the series resonance from the resonance frequency fx, and that causes the output level of the filter 68 at the resonance frequency fx to be no greater than the voltage V. The filter 68 may have a frequency characteristic that causes an attenuation gain Gf at the resonance frequency fx to be greater than the gain Gp at the peak of the series resonance.

This filter 68 enables the test apparatus 100 to decrease the effect of the series resonance in the voltage input to the ADC 66. In other words, the test apparatus 100 can decrease the fluctuation component in the voltage input to the ADC 66, and can therefore shorten the settling time of the voltage, thereby shortening the measurement time.

Figure 5:
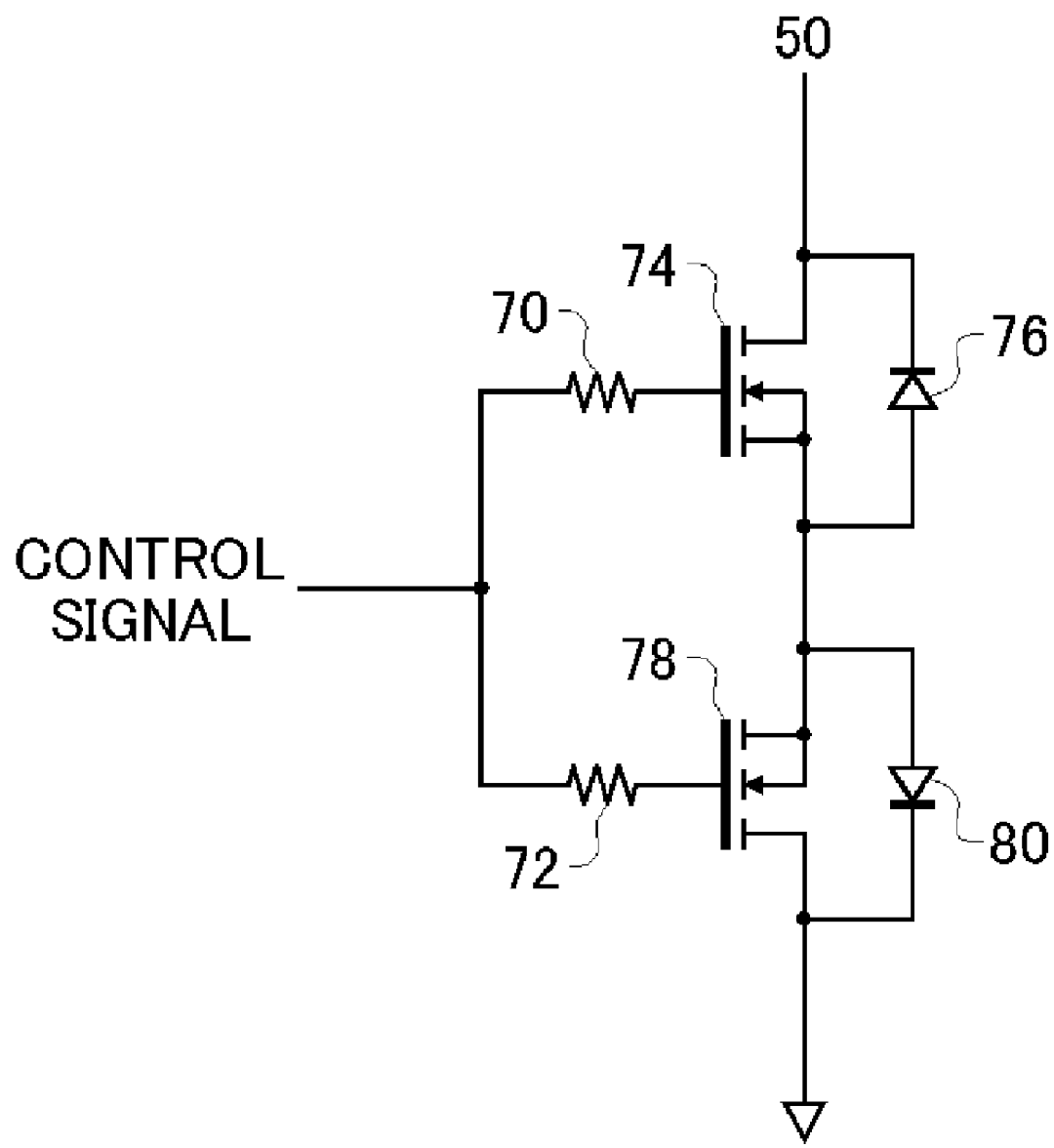
FIG. 5 shows an exemplary configuration of the switch 52.

FIG. 5 shows an exemplary configuration of the switch 52. The switch 52 includes transistors 74 and 78, diodes 76 and 80, and resistors 70 and 72. The transistors 74 and 78 are arranged serially between the intermediate capacitor 50 and the ground potential. The transistors 74 and 78 receive a control signal in parallel via the resistors 70 and 72. The transistors 74 and 78 may have the same polarity.

The diode 76 is a parasitic diode formed between the source and the drain of the transistor 74. The diode 80 is a parasitic diode that is formed between the source and the drain of the transistor 78. In the present embodiment, the diode 76 is oriented to have a forward direction from the ground potential to the intermediate capacitor 50, and the diode 80 is oriented to have a reverse direction from the intermediate capacitor 50 to the ground potential.

When the control voltage is H-level, the intermediate capacitor 50 is connected to the ground potential via the transistors 74 and 78. When the control voltage is L-level, both transistors are OFF and neither diode can cause current to flow in a reverse connection, and so the intermediate capacitor 50 is separated from the ground potential. With this configuration, the switch 52 can be small and have low power consumption.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
   a power supply that generates supply power supplied to the device under test;
   a transmission path that transmits the supply power generated by the power supply to the device under test;
   a high-capacitance capacitor that is provided between the transmission path and a ground potential;
   a low-capacitance capacitor that has a lower capacitance than the high-capacitance capacitor and that is provided between the transmission path and the ground potential at a position closer to the device under test than the high-capacitance capacitor is to the device under test;

an intermediate capacitor that is provided between the transmission path and the ground potential at a position between the high-capacitance capacitor and the low-capacitance capacitor; and a current measuring section that measures current flowing through the transmission path between the intermediate capacitor and the low-capacitance capacitor.

2. The test apparatus according to claim 1, wherein the intermediate capacitor has a capacitance greater than that of the low-capacitance capacitor and less than that of the high-capacitance capacitor.

3. The test apparatus according to claim 2, wherein the intermediate capacitor is connected to the transmission path at a position closer to the low-capacitance capacitor than to the high-capacitance capacitor.

4. The test apparatus according to claim 3, further comprising a test board that contacts the device under test, wherein the low-capacitance capacitor and the intermediate capacitor are provided on the test board.

5. The test apparatus according to claim 4, further comprising a connector that is provided on the transmission path and electrically connects the test board to the power supply, wherein the high-capacitance capacitor is connected to the connector on a power supply side of the transmission path.

6. The test apparatus according to claim 3, further comprising a semiconductor switch that switches whether the intermediate capacitor and the transmission path are electrically connected to each other.

7. The test apparatus according to claim 3, wherein the current measuring section includes:

a detecting section that detects, as a voltage, the current flowing through the transmission path;

a filter that eliminates a prescribed high-frequency component of the voltage output by the detecting section; and a voltage measuring section that measures the voltage output by the filter.

8. The test apparatus according to claim 7, wherein the filter has a frequency characteristic that causes (i) attenuation gain at a resonance frequency caused by series resonance of resistance in the detecting section, an inductance component in the transmission path between the intermediate capacitor and the low-capacitance capacitor, and the low-capacitance capacitor to be greater than (ii) gain of the series resonance at the resonance frequency.

* * * * *